United States Patent
Inagaki et al.

(10) Patent No.: US 7,671,438 B2
(45) Date of Patent: Mar. 2, 2010

(54) SOLID-STATE IMAGING DEVICE

(75) Inventors: Makoto Inagaki, Kyoto (JP); Masanori Kyougoku, Kyoto (JP)

(73) Assignee: Panasonic Corporation, Osaka (JP)

( * ) Notice: Subject to any disclaimer, the term of this patent is extended or adjusted under 35 U.S.C. 154(b) by 154 days.

(21) Appl. No.: 12/103,299

(22) Filed: Apr. 15, 2008

(65) Prior Publication Data

US 2009/0026571 A1    Jan. 29, 2009

(30) Foreign Application Priority Data

Jul. 27, 2007  (JP) .............................. 2007-196089

(51) Int. Cl.
*H01L 31/058* (2006.01)
(52) U.S. Cl. ...................... 257/469; 257/467
(58) Field of Classification Search ................. 257/467, 257/469
See application file for complete search history.

(56) References Cited

U.S. PATENT DOCUMENTS 5,717,459 A * 2/1998 Maki et al. .................. 348/312

7,388,183 B2 * 6/2008 Takayanagi et al. ...... 250/208.1

FOREIGN PATENT DOCUMENTS

JP          02-044872          2/1990

\* cited by examiner

*Primary Examiner*—Douglas M Menz
(74) *Attorney, Agent, or Firm*—McDermott Will & Emery LLP

(57) ABSTRACT

A solid-state imaging device includes first pixels and second pixels. Each of the first pixels and the second pixels includes a p-type diffusion layer formed in a semiconductor substrate and an n-type diffusion layer formed on the p-type diffusion layer. A first p-type implantation layer is formed on a surface side of the semiconductor substrate on the n-type diffusion layer of the first pixels. A second p-type implantation layer having a lower impurity concentration than the first p-type implantation layer or no p-type implantation layer is formed on a surface side of the semiconductor substrate on the n-type diffusion layer of the second pixels.

13 Claims, 5 Drawing Sheets

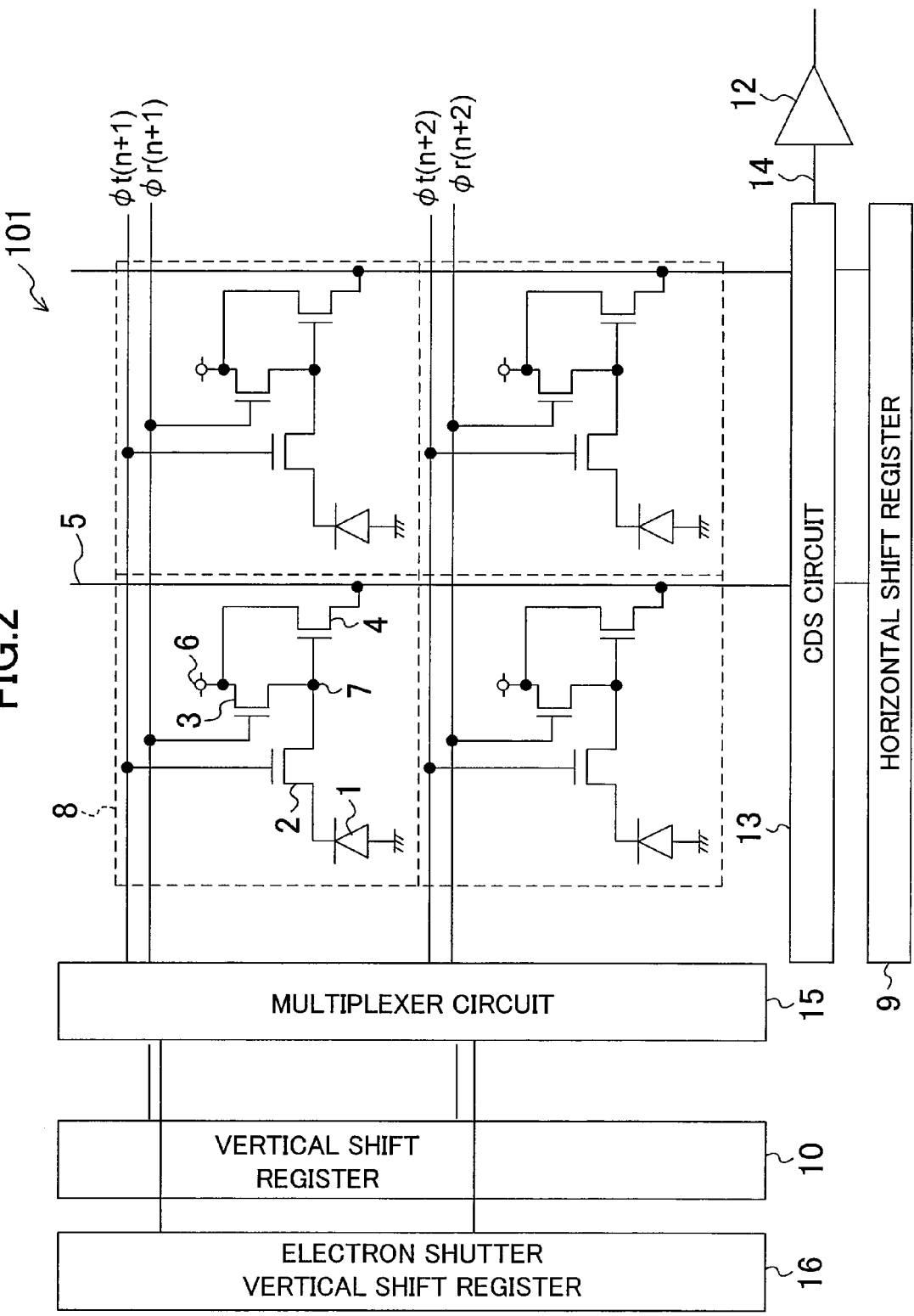

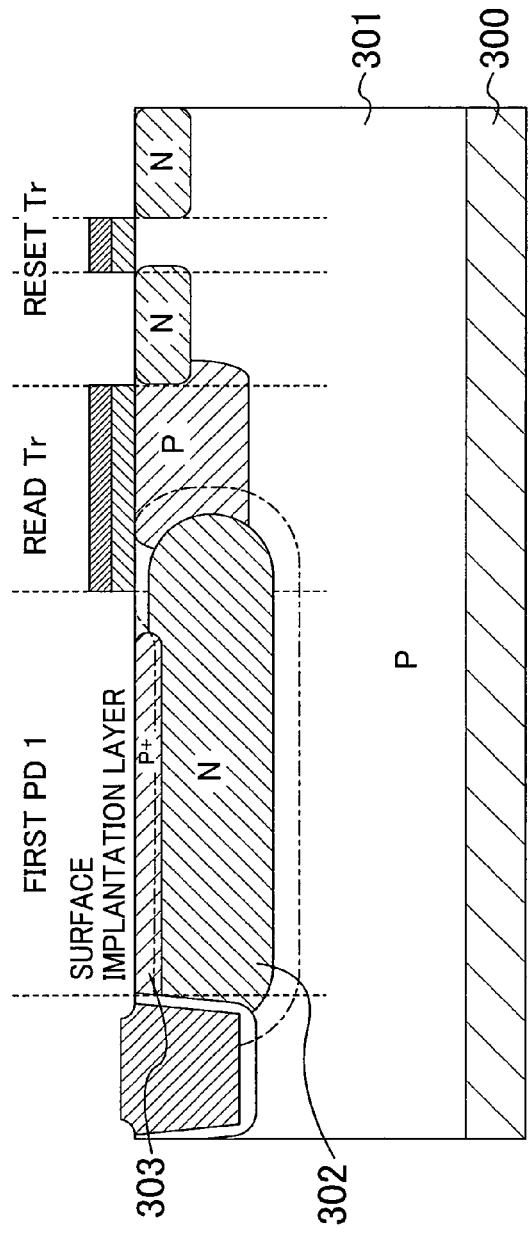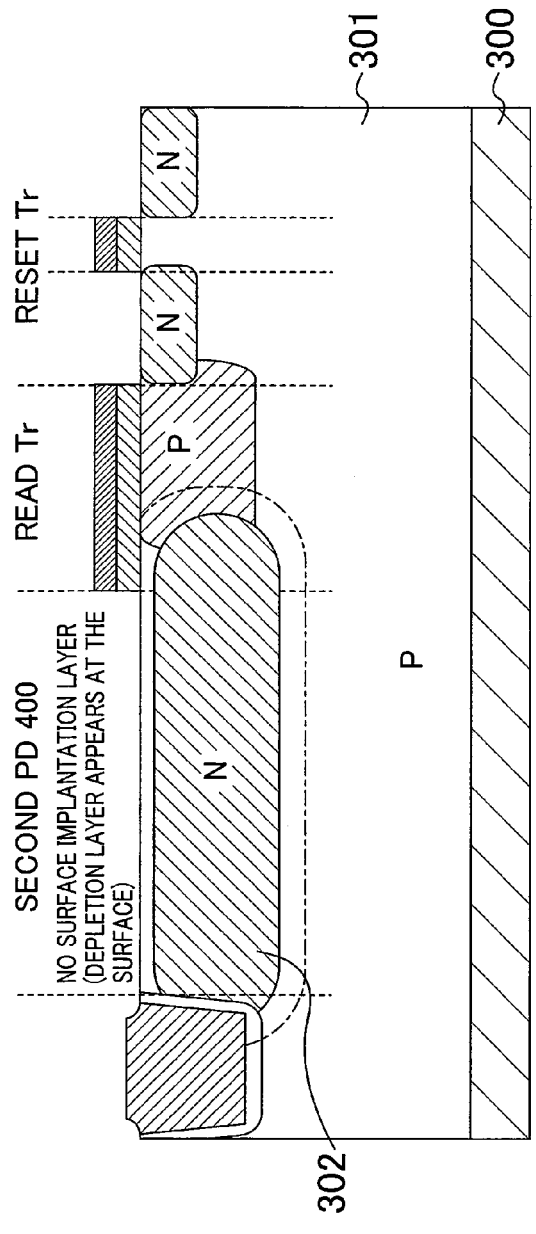

SOLID-STATE IMAGING DEVICE

BACKGROUND OF THE INVENTION

1. Field of the Invention

The invention relates to a solid-state imaging device that is used in a camera and the like.

2. Background Art

In recent years, solid-state imaging devices have been actively developed and their applications have been extended to various fields such as an in-vehicle camera and a surveillance camera in addition to a video camera and a digital still camera. An in-vehicle camera and a surveillance camera are sometimes used in a very severe environment as compared to a video camera, a digital still camera, and the like. For example, a surveillance camera that is installed outdoor, an in-vehicle camera that is mounted near a driving portion of a vehicle, and the like are expected to be used in an environment in which an ambient temperature changes significantly.

In commonly used CCD (Charge Coupled Device) type and MOS (Metal Oxide Semiconductor) type solid-state imaging devices, a dark current increases with an increase in temperature of the solid-state imaging device, which may cause significant degradation in image quality. Moreover, an increase in temperature of the solid-state imaging device itself may possibly reduce the service life of the solid-state imaging device. For example, an in-vehicle camera is used to control steering of a vehicle by detecting a white line on the road that continuously extends from far away to near the vehicle and to control braking of a vehicle by recognizing an environment ahead of the vehicle such as a road structure and a vehicle in front. Since degradation in image quality due to an increase in temperature of a solid-state imaging device may cause malfunction of the above control operations, a high quality level is required for a solid-state imaging device.

In view of the above problems, Japanese Laid-Open Patent Publication No. 2-44872, for example, proposes a technology of detecting a temperature of a solid-state imaging device by utilizing temperature dependency of a differential output (a dark current) between an output of a photoelectric conversion portion of an optical black portion provided in the solid-state imaging device and an empty feed output that does not include an output signal of the photoelectric conversion portion. In this technology, the temperature of the solid-state imaging device is kept constant by operating a cooling device based on the detected temperature information, whereby degradation in image quality is prevented.

SUMMARY OF THE INVENTION

In the conventional solid-state imaging device described in Japanese Laid-Open Patent Publication No. 2-44872, however, a dark current of a light-receiving photodiode (a photoelectric conversion portion) changes very slightly with a temperature change, which results in poor temperature detection accuracy. Moreover, since the conventional solid-state imaging device requires a cooling device, it is difficult to reduce the size of the solid-state imaging device itself.

In view of the above problems, it is an object of the invention to provide a solid-state imaging device capable of relatively easily detecting a temperature change with high accuracy while suppressing degradation in image quality due to a temperature change.

In order to solve the problems, a solid-state imaging device according to the invention includes a plurality of first pixels and a plurality of second pixels which are formed in a semiconductor substrate. Each of the first pixels includes a first impurity region of a first conductivity type formed in the semiconductor substrate, a second impurity region of a second conductivity type formed on the first impurity region and serving as a first photodiode, and a fifth impurity region of a first conductivity type formed on a surface side of the semiconductor substrate on the second impurity region. Each of the second pixels includes a third impurity region of a first conductivity type formed in the semiconductor substrate, a fourth impurity region of a second conductivity type formed on the third impurity region and serving as a second photodiode, and an impurity region of a first conductivity type having a same impurity concentration as the first impurity region and formed on a surface side of the semiconductor substrate on the fourth impurity region or a sixth impurity region of a first conductivity type having a lower impurity concentration than the fifth impurity region and formed on a surface side of the semiconductor substrate on the fourth impurity region. The second pixels may be temperature detection pixels.

In each of the first pixels, the fifth impurity region is formed on the surface side of the semiconductor substrate. Therefore, a depletion layer that is formed by a p-n junction of the photodiode can be prevented from being exposed at the surface portion of the semiconductor substrate, whereby generation of a dark current can be suppressed. In each of the second pixels, on the other hand, the impurity region having the same impurity concentration as the first impurity region of the first pixel or the sixth impurity region having a lower impurity concentration than the fifth impurity region of the first pixel is formed in the surface portion of the semiconductor substrate. In the second pixels, a depletion layer is exposed at the surface portion of the semiconductor substrate and a multiplicity of surface levels are generated. As a result, a higher dark current is generated as compared to the first pixels. Since the dark current has temperature dependency, temperature information of the solid-state imaging device can be accurately detected by processing an electric signal that is output from the second pixels. The second pixels can thus be used as the temperature detection pixels. By using the solid-state imaging device of the invention, appropriate image processing can be performed on the imaging signal that is output from the first pixels, based on reliable temperature information. Therefore, a high quality image can be output while suppressing degradation in image quality due to generation of a dark current.

The plurality of first pixels may include a first reading portion for reading a signal generated in the first photodiode according to incident light, and the plurality of second pixels may include a second reading portion for reading a temperature detection signal generated in the second photodiode.

With this structure, by using the first pixels and the second pixels as imaging pixels and temperature detection pixels, respectively, each output signal from the first pixels and the second pixels can be respectively read by the first reading portion and the second reading portion, and the read signals can be output through a common read path. Therefore, the temperature of the solid-state imaging device can be relatively easily detected by using normal driving conditions without conducting special driving for obtaining temperature information. By performing various kinds of video processing on the imaging signal from the imaging pixels (the first pixels) based on the obtained temperature information, a video signal can be obtained while suppressing degradation in image quality due to a temperature change.

The solid-state imaging device of the invention may further include a signal processing circuit including a temperature table storage portion having temperature information prestored therein and a temperature calculation portion for calculating a temperature of the plurality of second pixels by comparing an output signal of each of the plurality of second pixels with the temperature information stored in the temperature table storage portion. The signal processing circuit may further include an image correction portion for processing an output signal that is output as an image signal from each of the plurality of first pixels, based on the temperature calculated in the temperature calculation portion, to correct the image signal.

In this structure, the solid-state imaging device of the invention further includes the signal processing circuit including the temperature table storage portion, the temperature calculation portion, and the image correction portion. Therefore, the temperature of the solid-state imaging device can be accurately detected by comparing the output signal of the second pixels with the temperature information prestored in the temperature table storage portion by the temperature calculation portion. Moreover, by performing various kinds of video processing on the imaging signal (the image signal) from the first pixels based on the calculated temperature information, an image which is less likely to be degraded due to the temperature can be relatively easily obtained.

The solid-state imaging device of the invention may further include a power supply control circuit for controlling supply of a power supply voltage according to the temperature of the second pixels calculated by the second photodiode. The power supply control circuit may stop supply of the power supply voltage according to the temperature of the second pixels. The power supply control circuit may reduce the power supply voltage according to the temperature of the second pixels.

In this structure, the solid-state imaging device of the invention includes the power supply control circuit capable of controlling the power supply voltage based on the temperature information. Therefore, even when, for example, the solid-state imaging device is used in a severe environment and the temperature of the solid-state imaging device increases, the power supply voltage of the solid-state imaging device can be reduced or stopped after the temperature of the second pixels is detected. Therefore, semiconductor elements provided in the solid-state imaging device can be prevented from degrading due to the temperature increase. As a result, a solid-state imaging device that can be used in a relatively severe environment while suppressing reduction in service life of semiconductor elements can be implemented.

BRIEF DESCRIPTION OF THE DRAWINGS

FIG. 2 shows a structure of a solid-state imaging device according to a first embodiment of the invention;

FIGS. 3A and 3B are cross-sectional views respectively showing a structure of an imaging pixel and a temperature detection pixel of the solid-state imaging device according to the first embodiment;

DETAILED DESCRIPTION OF THE PREFERRED EMBODIMENTS

First Embodiment

Figure 1:
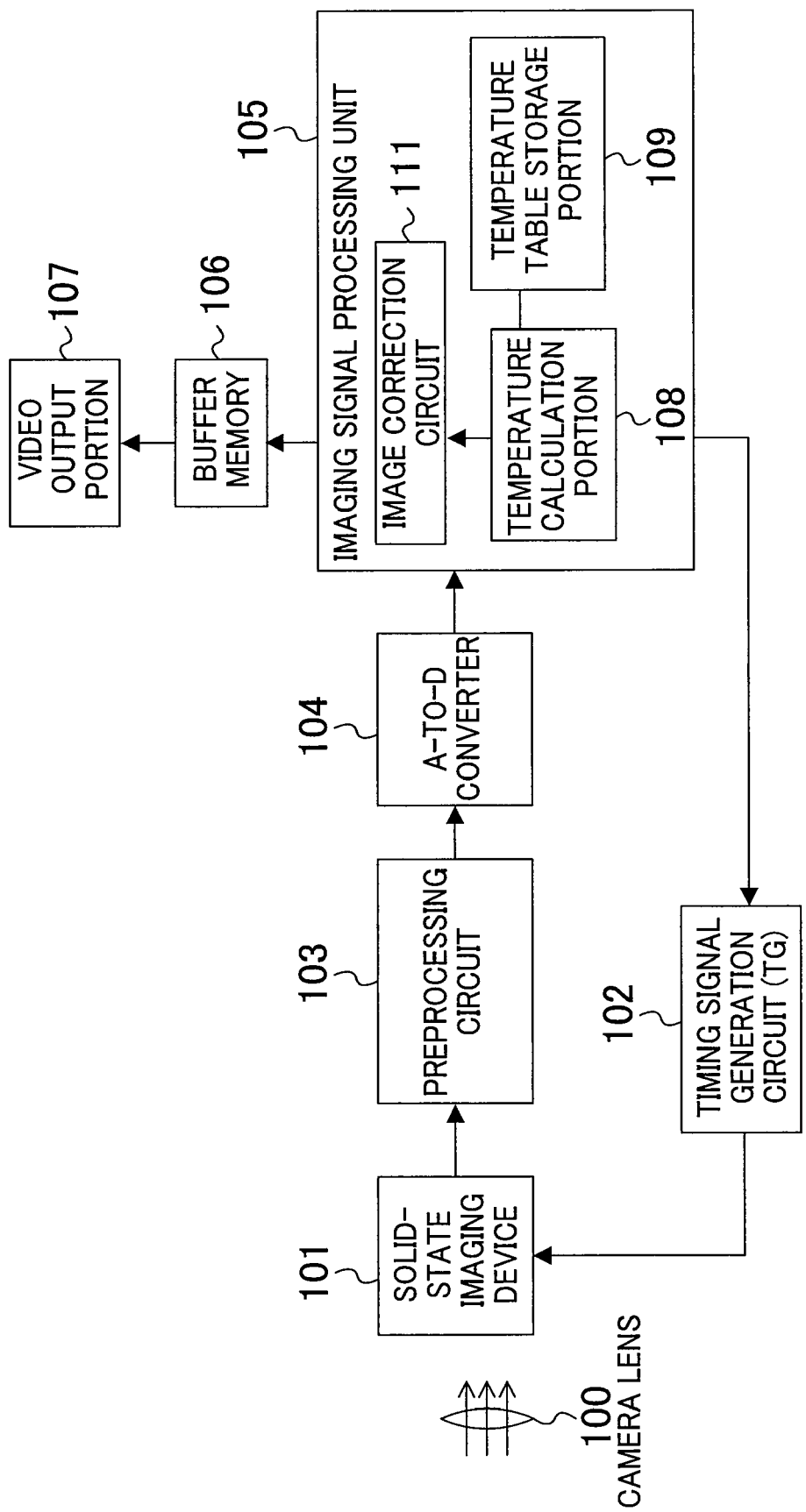
FIG. 1 shows a structure of a camera according to a first embodiment of the invention.

Hereinafter, a solid-state imaging device according to a first embodiment of the invention will be described with reference to FIG. 1. A camera having the solid-state imaging device of this embodiment will be described herein as an example. FIG. 1 shows a structure of a camera according to this embodiment.

As shown in FIG. 1, the camera of this embodiment includes a camera lens 100, a solid-state imaging device (a solid-state imaging element) 101 for producing a signal by photoelectric conversion of incident light collected by the camera lens 100, a preprocessing circuit 103, an A-to-D (analog-to-digital) converter 104, an imaging signal processing unit (a signal processing circuit) 105, a buffer memory 106, a video output portion 107, and a timing signal generation circuit (TG) 102. The imaging signal processing unit 105 includes a temperature calculation portion 108, a temperature table storage portion 109, and an image correction circuit 111. The camera of this embodiment will now be described in details.

The solid-state imaging device (the solid-state imaging element) 101 includes a plurality of imaging pixels (a pixel array) and a plurality of temperature detection pixels. The plurality of imaging pixels are arranged in a matrix pattern and include a photoelectric conversion portion formed by a photodiode or the like. The plurality of temperature detection pixels include a temperature detection portion for generating a temperature detection signal. Incident light is collected by the camera lens 100 onto the plurality of imaging pixels and converted into an electric signal (an analog signal) by the photoelectric conversion portion. The solid-state imaging device 101 outputs the electric signal received from the photoelectric conversion portion to the preprocessing circuit 103 as image information that indicates an image produced on the pixel array. The solid-state imaging device 101 also outputs the electric signal received from the temperature detection portion to the preprocessing circuit 103 as temperature information.

The preprocessing circuit 103 includes, for example, a CDS (Correlated Double Sampling) circuit for reducing output noise included in an analog signal, a nonlinear amplifying circuit for amplifying an analog signal before analog-to-digital conversion, and the like. The preprocessing circuit 103 receives an electric signal (an analog signal) from the solid-state imaging device 101, performs processing such as noise reduction and amplification of the electric signal by using the CDS circuit and the nonlinear amplifying circuit, and outputs the resultant electric signal to the A-to-D converter 104.

The A-to-D converter 104 receives the electric signal (the analog signal) from the preprocessing circuit 103, converts the electric signal into a digital signal, and outputs the digital signal to the imaging signal processing unit 105.

The imaging signal processing unit 105 receives the digital signal of the imaging pixels from the A-to-D converter 104 and performs various kinds of video processing on the received digital signal by using the image correction circuit 111. The imaging signal processing unit 105 then stores the resultant video signal in the buffer memory 106. When video processing is performed by the image correction circuit 111, the imaging signal processing unit 105 first calculates temperature information of the solid-state imaging device 101 by the temperature calculation portion 108 and the temperature table storage portion 109 based on a digital output signal of the temperature detection pixels. Based on the calculated temperature information, the imaging signal processing unit 105 performs processing such as shading correction and white spot correction on the digital signal of the imaging pixels. The temperature detection method of the solid-state imaging device 101 will be described later in detail.

The buffer memory 106 then receives the video signal from the imaging signal processing unit 105 and temporarily stores the received video signal therein. The video output portion 107 reads the video signal temporarily stored in the buffer memory 106 and outputs the video signal to, e.g., a display device (not shown).

Finally, the timing signal generation circuit (TG) 102 receives driving information from the imaging signal processing unit 105 and produces a timing signal required to drive the solid-state imaging device 101 based on the received driving information. The timing signal generation circuit 102 outputs the timing signal to the solid-state imaging device 101. As has been described above, the camera of this embodiment corrects the output signal of the imaging pixels based on the calculated temperature information and outputs the corrected signal as a video signal.

Figure 4:
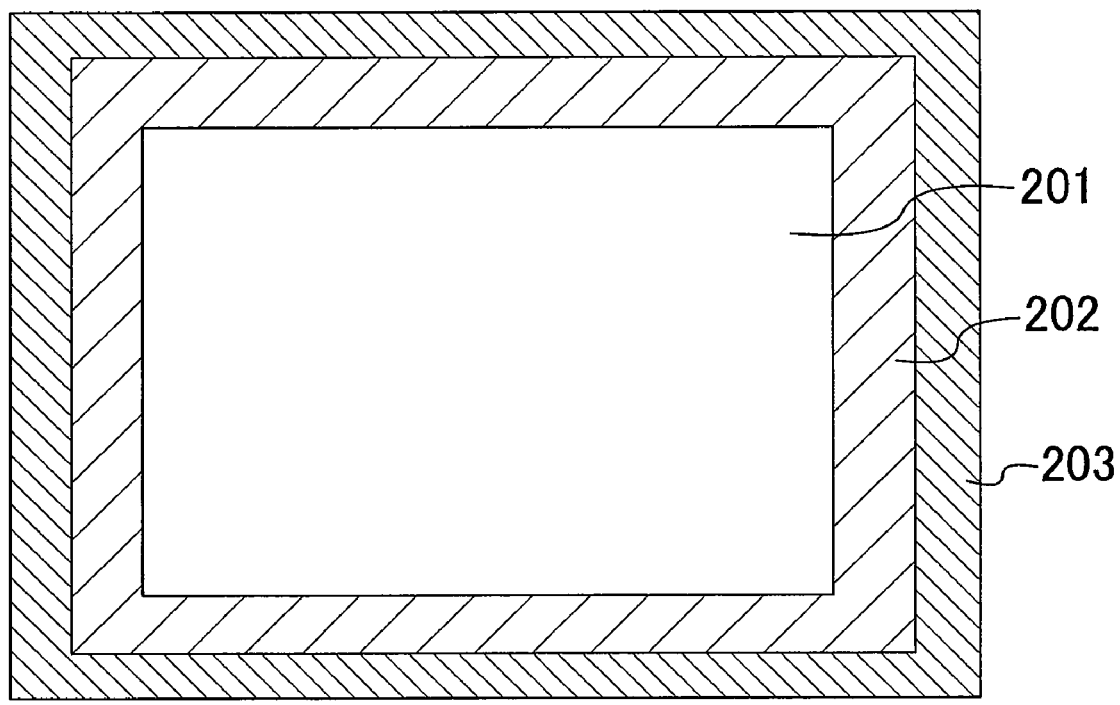
FIG. 4 is a top view showing a structure of the solid-state imaging device according to the first embodiment.

Hereinafter, the solid-state imaging device (the solid-state imaging element) 101 used in the camera of this embodiment will now be described in detail with reference to FIG. 2. FIG. 2 shows a structure of a part of the solid-state imaging device of this embodiment. FIG. 4 is a top view showing a structure of the solid-state imaging device of this embodiment.

As shown in FIG. 2, the solid-state imaging device 101 of this embodiment includes a pixel array 8, a plurality of vertical signal lines 5, a plurality of read signal lines Φt, and a plurality of reset signal lines Φr. The pixel array 8 includes a plurality of imaging pixels arranged two dimensionally. FIG. 2 shows only a part of the imaging pixels provided in the $(n+1)^{th}$ and $(n+2)^{th}$ rows in the pixel array 8 (n is a positive integer).

Each of the plurality of imaging pixels in the pixel array 8 is formed as an amplifying unit pixel. Each imaging pixel includes a first photodiode (PD) 1 (an photoelectric conversion portion; a light receiving portion) for accumulating a signal generated based on incident light, a read transistor 2 for reading charges accumulated in the first PD 1, a floating diffusion (FD) portion 7 for temporarily accumulating the charges read through the read transistor 2, a reset transistor 3 for resetting a potential of the FD portion 7, and a detection transistor (an amplifying transistor) 4 for outputting an electric signal according to the potential of the FD portion 7.

A Vdd power supply 6 is connected to the respective sources of the reset transistor 3 and the detection transistor 4. A read signal line Φt is connected to the respective gates of the read transistors 2 in the imaging pixels arranged in the same row. A reset signal line Φr is connected to the respective gates of the reset transistors 3 in the imaging pixels arranged in the same row. Vertical signal lines 5 are respectively connected to the respective drains of the detection transistors 4 in the imaging pixels arranged in the same row.

The solid-state imaging device 101 of this embodiment further includes a multiplexer circuit 15, a vertical shift register 10, an electron shutter vertical shift register 16, a CDS circuit 13, a horizontal shift register 9, a horizontal signal line 14, and an output amplifier 12. In the solid-state imaging device 101 of this embodiment, the multiplexer circuit 15, the vertical shift register 10, and the electron shutter vertical shift register 16 supplies a read pulse to a read signal line Φt and a reset pulse to a reset signal line Φr and outputs an output signal of each read transistor 2 to a vertical signal line 5. The horizontal shift register 9 and the horizontal signal line 14 output an output signal of a vertical signal line 5 in the vertical direction.

More specifically, the electron shutter vertical shift register 16 receives a timing signal from the timing signal generation circuit 102 (see FIG. 1) and outputs the received timing signal and a read pulse to be supplied to a read transistor 2 to the multiplexer circuit 15. As a result, a read signal line Φt(n) is sequentially selected on a row-by-row basis, and charges accumulated in each first PD 1 in the $n^{th}$ row are read by a corresponding read transistor 2 to a corresponding FD portion 7. The charges thus read to the FD portion 7 are reset by driving a corresponding reset transistor 3 with a reset pulse supplied to a corresponding reset signal line Φr(n). This electron shutter operation is performed in order to read charges in the first PD 1 and discharge the read charges as unnecessary charges during charge accumulation time. The charge accumulation time of the first PD 1 in each imaging pixel is thus controlled.

The vertical shift register 10 receives a timing signal from the timing signal generation circuit 102 and outputs the received timing signal and a read pulse to be supplied to a read transistor 2 to the multiplexer circuit 15. As a result, charges accumulated in each first PD 1 in each row are output to a corresponding FD portion 7, and a signal according to the FD portion 7 is output from a corresponding detection transistor 4 to a corresponding vertical signal line 5. The signal thus output to the vertical signal line 5 is temporarily stored in the CDS circuit 13.

The horizontal shift register 9 then sequentially selects a vertical signal line 5 on a column-by-column basis based on a timing signal received from the timing signal generation circuit 102. In response to the selection of the vertical signal lines 5, the signals of the imaging pixels corresponding to a single row, which are temporarily stored in the CDS circuit 13, are sequentially output from the output amplifier 12 through the vertical signal line 14.

Although not shown in FIG. 2, the solid-state imaging device 101 of this embodiment further includes optical black pixels and temperature detection pixels around an imaging region 201 in which the imaging pixels are formed.

More specifically, as shown in FIG. 4, a light shielding region 202 in which the optical black pixels are formed is provided around the imaging region 201 in which the imaging pixels are formed. For example, the imaging region 201 is formed by 640×480 pixels and the light shielding region 202 is formed by 20×20 pixels. The light shielding region 202 has the same structure as the imaging pixels and is covered with a light shielding layer, such as a metal layer, for blocking incident light. Note that a signal that is output from the light shielding region 202 is used as a reference signal of an optical black level.

A light receiving region 203 in which the temperature detection pixels are formed is provided around the light shielding region 202 and is formed by, for example, 10×10 pixels. The light receiving region 203 has a temperature detection portion for generating a temperature detection signal. Like the light shielding region 202, the light receiving region 203 is covered with a light shielding layer such as a metal layer.

In the solid-state imaging device 101 of this embodiment, the photoelectric conversion portion (the first PD 1) of the imaging pixels and the temperature detection portion of the temperature detection pixels use a photodiode as a light receiving element. However, the structure of the photodiode is different between the imaging pixels and the temperature detection pixels. This will now be described with reference to FIGS. 3A and 3B.

FIG. 3A is a cross-sectional view of a structure of an imaging pixel in the solid-state imaging device 101 of this embodiment. FIG. 3B is a cross-sectional view of a structure of a temperature detection pixel in the solid-state imaging device of this embodiment.

As shown in FIG. 3A, the imaging pixel of this embodiment includes a p-type diffusion layer (a p-type impurity region) 301 formed in a semiconductor substrate 300, an n-type diffusion layer (an n-type impurity region) 302 formed on the p-type diffusion layer 201 and serving as a photodiode (a photoelectric conversion portion; a light receiving portion), and a first p-type implantation layer (a p-type impurity region) 303 formed in a surface portion of the semiconductor substrate on the n-type diffusion layer 302. The first p-type implantation layer 303 is formed to prevent a depletion layer that is formed by a p-n junction from being exposed at the surface portion of the semiconductor substrate 300. Accordingly, surface levels that are generated near the surface of the semiconductor substrate 300 can be significantly reduced and generation of a dark current can be suppressed. Note that the first photodiode (PD) 1 shown in FIGS. 2 and 3A indicates the n-type diffusion layer 302 formed on the p-type diffusion layer 301.

As shown in FIG. 3B, the temperature detection pixel of this embodiment includes a p-type diffusion layer 301 formed in a semiconductor substrate 300 and an n-type diffusion layer 302 formed on the p-type diffusion layer 301 and serving as a photodiode (a photoelectric conversion portion; a light receiving portion). Unlike the imaging pixel, in the temperature detection pixel, a p-type implantation layer is not formed in a surface portion of the semiconductor layer 300. The p-type implantation layer may be formed. In this case, however, the p-type implantation layer has a lower impurity concentration than the first p-type implantation layer 303. Note that a second photodiode (PD) 400 shown in FIG. 3B indicates the n-type diffusion layer 302 formed on the p-type diffusion layer 301.

Accordingly, in the second PD 400 of the temperature detection pixel, a depletion layer is exposed at the surface portion of the semiconductor substrate 300 and a multiplicity of surface levels are generated. As a result, a higher dark current is generated as compared to the first PD 1. The surface levels have a property of being activated at a high temperature. Therefore, a significant increase in the dark current is recognized with an increase in temperature of the second PD 400 of the temperature detection pixel. By utilizing this temperature dependency of the dark current, the solid-state imaging device 101 of this embodiment can detect the temperature of the temperature detection pixels by processing an electric signal that is output from the second PD 400 of the temperature detection pixel.

Hereinafter, a temperature detection method of the solid-state imaging device 101 of this embodiment will be described in detail (see mainly FIG. 1). Since operation of each processing circuit and other elements is the same as that described above regarding the camera of this embodiment, only simplified description thereof will be given below.

In the solid-state imaging device 101, output signals from the imaging pixels, optical black pixels, and temperature detection pixels in a prescribed row are sequentially output from the output amplifier 12 to the preprocessing circuit 103 through the vertical signal lines 5 and the horizontal signal line 14. The preprocessing circuit 103 receives each analog signal from the solid-state imaging device 101, performs processing such as noise reduction and amplification on each received analog signal, and outputs each processed analog signal to the A-to-D converter 104.

The A-to-D converter 104 then converts each of the processed analog signals to a digital signal and outputs each digital signal to the imaging signal processing unit 105.

Of the output signals from the A-to-D converter 104, the output signals of the temperature detection pixels (detection signals) are applied to the temperature calculation portion 108 in the imaging signal processing unit 105. The temperature calculation portion 108 calculates temperature information of the temperature detection pixels by comparing the detection signals with temperature information prestored in the temperature table storage portion 109 by a comparator (not shown) or the like. The temperature of the solid-state imaging device 101 can thus be detected.

The output signals of the imaging pixels (imaging signals) are applied to the image correction circuit 111, and various types of video processing are performed on the imaging signals based on the temperature information calculated in the temperature calculation portion 108. More specifically, for example, temperature distribution of the imaging pixel array is obtained from the calculated temperature information and a correction value is applied to the signal of each imaging element so as to correct shading and white spots expected from the temperature distribution. Note that arithmetic operation of the imaging signals is performed based on the reference signal that is output from the optical black pixels. The imaging signals subjected to the video processing are stored in the buffer memory 106 and then output to the video output portion 107. Image processing of the imaging signals can thus be performed by detecting the temperature of the solid-state imaging device of this embodiment.

The solid-state imaging device of this embodiment is characterized in that the imaging pixels and the temperature detection pixels are provided on the same semiconductor chip. With this structure, each output signal from the imaging pixels and the temperature detection pixels can be output to the processing circuit and the like through a common read path. Therefore, the temperature of the solid-state imaging device can be relatively easily detected by using normal driving conditions without conducting special driving for obtaining the temperature information. By processing the imaging signals based on the obtained temperature information, a video signal can be output while suppressing degradation in image quality due to a temperature change. Moreover, a temperature detecting element such as a temperature sensor is not required outside the solid-state imaging device, which is advantageous for size reduction of the solid-state imaging device. It is preferable to provide the temperature detection pixels around the imaging pixels because the temperature of the imaging pixels can be measured more accurately as compared to the case where the temperature detection pixels and the imaging pixels are distantly located from each other.

In the solid-state imaging device of this embodiment, an implantation layer is not formed in the surface portion of the second PD 400 of the temperature detection portion. The implantation layer may be formed. In this case, however, the implantation layer has a lower impurity concentration than the first p-type implantation layer 303 formed in the surface portion of the first PD 1. With this structure, a depletion layer formed by a p-n junction of the second PD 400 extends to the surface portion of the semiconductor substrate 300 and a dark current is likely to flow in the second PD 400 of the temperature detection pixels. Therefore, in the solid-state imaging device of this embodiment, a larger output signal than in the conventional solid-state imaging device can be obtained even when, for example, a small dark current flows at a low temperature. Therefore, temperature information can be accurately calculated. As a result, based on the reliable temperature information, appropriate image processing can be performed on the imaging signals that are output from the imaging pixels. A high quality image can thus be output while suppressing degradation in image quality due to generation of a dark current.

In the case of normal pixels, when a depletion layer extends to the surface of the semiconductor substrate 300 and surface levels are generated, noise is increased and a high image quality cannot be obtained. Therefore, surface levels are not actively generated in a photodiode in the conventional examples. The inventors paid attention to the fact that a dark current increases as surface levels are generated in a surface portion of a photodiode, and conducted studies to use this fact in temperature measurement. As a result, the inventors found that a dark current significantly increases as surface levels are activated by heat and that the temperature can be detected with sufficiently practical accuracy by using this phenomenon. Especially, by forming the first p-type implantation layer 303 in the substrate surface portion of the imaging pixels and not forming the first p-type implantation layer 303 in the substrate surface portion of the temperature detecting pixels as shown in FIGS. 3A and 3B, the temperature detecting pixels can be formed without increasing the number of steps of the manufacturing process. In the case of forming a low concentration p-type implantation layer in the substrate surface portion of the temperature detecting pixels, temperature detection accuracy can be adjusted as appropriate by adjusting the impurity concentration of the p-type implantation layer.

The solid-state imaging device 101 of this embodiment may be provided on the same semiconductor chip as the preprocessing circuit 103, the A-to-D converter 104, the imaging signal processing unit (the signal processing circuit) 105, and the timing signal generation circuit 102. In this case, semiconductor elements provided in the solid-state imaging device 101 and semiconductor elements provided in each circuit such as the imaging signal processing unit 105 can be fabricated in the same process. Therefore, the solid-state imaging device 101 having the above effects can be relatively easily manufactured. This structure is also advantageous to reduce the size of the solid-state imaging device 101. On the other hand, in the case where the solid-state imaging device 101 and the circuits such as the imaging signal processing unit 105 are provided on separate semiconductor chips, MOS transistors of the imaging signal processing unit 105 can be optimized in their structure or the like. Therefore, signal processing accuracy can be improved.

In this embodiment, the temperature of the solid-state imaging device may be calculated by comparing an average value of output signals of a plurality of temperature detection pixels with the temperature information stored in the temperature table storage portion 109. In this case, temperature detection accuracy can further be improved. For example, in the case where ten temperature detection pixels per row are provided around the imaging pixels as shown in FIG. 4, an average value of output signals from the ten temperature detection pixels is calculated and compared with the temperature information stored in the temperature table storage portion 109. The number of temperature detection pixels to be used to calculate an average value is not limited to the number of temperature detection pixels arranged in each row. Temperature detection pixels in a plurality of rows may be selected and an average value may be calculated from the selected temperature detection pixels.

In order to further improve detection accuracy of the temperature of the temperature detection pixels in the solid-state imaging device of this embodiment, a timing signal may be generated in the timing signal processing unit 105 so that, for example, a time until a signal generated in the second PD 400 of the temperature detection pixels is read by a read transistor (a storage time) is increased. For example, the storage time can be relatively easily increased by generating a timing signal so that a read pulse is applied to the second PD 400 of the temperature detection pixels every several frames. This increases an output signal of the second PD 400 of the temperature detection pixels, whereby the temperature of the temperature detection pixels can be detected with relatively high accuracy even when a change in dark current is small at a low temperature or the like.

A MOS type solid-state imaging device having amplifying unit pixels has been described in this embodiment. However, the invention is not limited to this, and a CCD type solid-state imaging device may be used.

Second Embodiment

Figure 5:
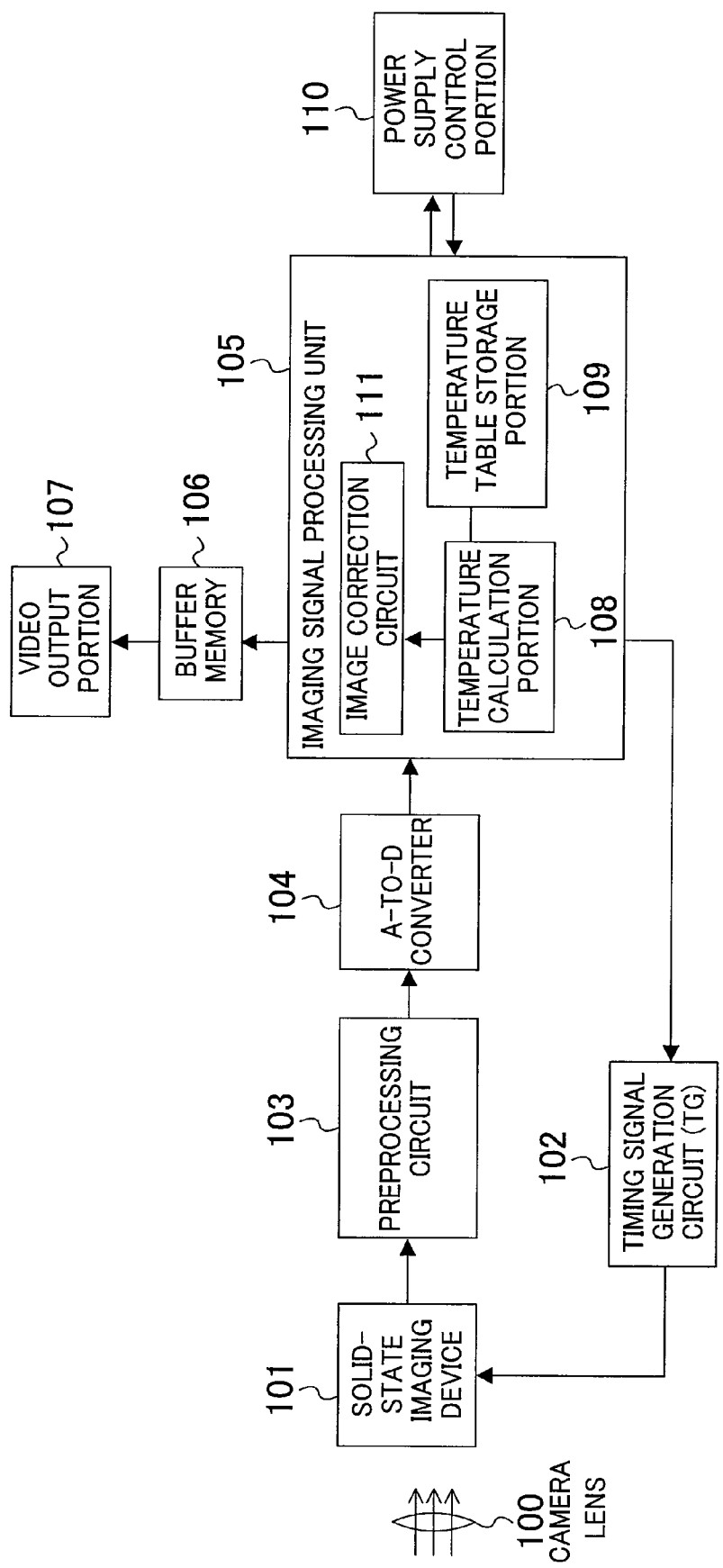
FIG. 5 shows a structure of a camera according to a second embodiment of the invention.

Hereinafter, a solid-state imaging device according to a second embodiment of the invention will be described with reference to the figures. Since the solid-state imaging device of this embodiment is the same as the solid-state imaging device of the first embodiment except to a part of the structure, only simplified description thereof will be given below. FIG. 5 shows a structure of a camera including the solid-state imaging device of this embodiment.

As shown in FIG. 5, the camera of this embodiment includes a camera lens 100, a solid-state imaging device (a solid-state imaging element) 101 for generating a signal by photoelectric conversion of incident light collected by the camera lens 100, a preprocessing circuit 103, an A-to-D converter 104, an imaging signal processing unit (a signal processing circuit) 105, a buffer memory 106, a video output portion 107, a timing signal generating circuit (TG) 102, and a power supply control portion 110. The imaging signal processing unit 105 includes a temperature calculation portion 108, a temperature table storage portion 109, and an image correction circuit 111.

The camera of this embodiment is different from that of the first embodiment in that the camera of this embodiment includes the power supply control portion 110. The power supply control portion 110 receives temperature information calculated in the imaging signal processing unit 105 and controls a power supply voltage that is supplied to each part of the solid-state imaging device 101 based on the received temperature information. More specifically, in the case where the temperature information received from the temperature calculation portion 108 of the imaging signal processing unit 105 is, for example, 60° C. or higher, the power supply control portion 110 stops supply of the power supply voltage to the solid-state imaging device 101 or reduces the power supply voltage. Note that the power supply voltage to the elements such as the preprocessing circuit 103 and the imaging signal processing unit 105 can also be controlled in addition to the power supply voltage to each part of the solid-state imaging device 101. The power supply control portion 110 may be provided outside the solid-state imaging device 101 or may be provided on the same semiconductor chip as the solid-state imaging device 101 together with, for example, the imaging signal processing unit 105.

The structure and the temperature detection method of the solid-state imaging device 101 of this embodiment are the same as those described in the first embodiment.

The solid-state imaging device of this embodiment is characterized by including the power supply control portion capable of controlling the power supply voltage based on the temperature information. With this structure, even when, for example, the solid-state imaging device 101 is used in a severe environment and the temperature of the solid-state imaging device 101 increases, the power supply voltage of the solid-state imaging device 101 can be reduced or stopped after the temperature of the temperature detection pixels is detected. Therefore, semiconductor elements provided in the solid-state imaging device 101 can be prevented from degrading due to the temperature increase. As a result, a solid-state imaging device that can be used in a relatively severe environment while suppressing reduction in service life of semiconductor elements can be implemented.

In this embodiment, the size of the solid-state imaging device can be reduced as compared to the conventional solid-state imaging device having a cooling device.

As has been described above, the solid-state imaging device of the invention is useful for quality improvement and size reduction of a solid-state imaging device such as a digital camera.

What is claimed is:

1. A solid-state imaging device, comprising:
a plurality of first pixels and a plurality of second pixels which are formed in a semiconductor substrate, wherein
each of the first pixels includes a first impurity region of a first conductivity type formed in the semiconductor substrate, a second impurity region of a second conductivity type formed on the first impurity region and serving as a first photodiode, and a fifth impurity region of a first conductivity type formed on a surface side of the semiconductor substrate on the second impurity region, and
each of the second pixels includes a third impurity region of a first conductivity type formed in the semiconductor substrate, a fourth impurity region of a second conductivity type formed on the third impurity region and serving as a second photodiode, and an impurity region of a first conductivity type having a same impurity concentration as the first impurity region and formed on a surface side of the semiconductor substrate on the fourth impurity region or a sixth impurity region of a first conductivity type having a lower impurity concentration than the fifth impurity region and formed on a surface side of the semiconductor substrate on the fourth impurity region.

2. The solid-state imaging device according to claim 1, wherein the second pixels are temperature detection pixels.

3. The solid-state imaging device according to claim 1, wherein the plurality of second pixels are covered with a light shielding layer for blocking incident light.

4. The solid-state imaging device according to claim 1, further comprising: an imaging region having the plurality of first pixels arranged therein two-dimensionally; and a light receiving region provided around the imaging region and having the plurality of second pixels arranged therein.

5. The solid-state imaging device according to claim 4, further comprising a light shielding region formed between the imaging region and the light receiving region, having a plurality of optical black pixels having a same structure as the first pixels arranged therein, and covered with a light shielding layer.

6. The solid-state imaging device according to claim 1, wherein the plurality of first pixels include a first reading portion for reading a signal generated in the first photodiode according to incident light, and the plurality of second pixels include a second reading portion for reading a temperature detection signal generated in the second photodiode.

7. The solid-state imaging device according to claim 6, further comprising a signal processing circuit including a temperature table storage portion having temperature information prestored therein and a temperature calculation portion for calculating a temperature of the plurality of second pixels by comparing an output signal of each of the plurality of second pixels with the temperature information stored in the temperature table storage portion.

8. The solid-state imaging device according to claim 7, wherein the signal processing circuit further includes an image correction portion for processing an output signal that is output as an image signal from each of the plurality of first pixels, based on the temperature calculated in the temperature calculation portion, to correct the image signal.

9. The solid-state imaging device according to claim 8, wherein the temperature calculation portion calculates the temperature of the second pixels by using an average value of output signals of at least two of the plurality of second pixels.

10. The solid-state imaging device according to claim 7, wherein a storage time of the signal generated in the second photodiode, that is, a time until the signal generated in the second photodiode is read by the second reading portion, is longer than a storage time of the signal generated in the first photodiode, that is, a time until the signal generated in the first photodiode is read by the first reading portion.

11. The solid-state imaging device according to claim 7, further comprising a power supply control circuit for controlling supply of a power supply voltage according to the temperature of the second pixels calculated by the second photodiode.

12. The solid-state imaging device according to claim 11, wherein the power supply control circuit stops supply of the power supply voltage according to the temperature of the second pixels.

13. The solid-state imaging device according to claim 11, wherein the power supply control circuit reduces the power supply voltage according to the temperature of the second pixels.

* * * * *